United States Patent
Nakamura et al.

(10) Patent No.: US 11,256,171 B2
(45) Date of Patent: Feb. 22, 2022

(54) FILM RESIST AND METHOD OF MANUFACTURING SEMICONDUCTOR DEVICE

(71) Applicant: Mitsubishi Electric Corporation, Tokyo (JP)

(72) Inventors: Hiroyuki Nakamura, Fukuoka (JP); Shinya Soneda, Tokyo (JP); Shoichi Kuga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 435 days.

(21) Appl. No.: 16/179,150

(22) Filed: Nov. 2, 2018

(65) Prior Publication Data
US 2019/0243245 A1    Aug. 8, 2019

(30) Foreign Application Priority Data
Feb. 7, 2018 (JP) .............................. JP2018-019822

(51) Int. Cl.
| G03F 7/09 | (2006.01) |
| H01L 23/544 | (2006.01) |
| H01L 21/027 | (2006.01) |
| G03F 7/20 | (2006.01) |
| G03F 7/26 | (2006.01) |
| G03F 1/42 | (2012.01) |
| G03F 9/00 | (2006.01) |

(52) U.S. Cl.
CPC .............. *G03F 7/09* (2013.01); *G03F 7/20* (2013.01); *G03F 7/26* (2013.01); *G03F 9/7084* (2013.01); *H01L 21/0274* (2013.01); *H01L 23/544* (2013.01); *H01L 2223/5442* (2013.01); *H01L 2223/54426* (2013.01)

(58) Field of Classification Search
CPC . G03F 7/09; G03F 9/7084; G03F 7/20; G03F 7/26; H01L 21/0274; H01L 23/544; H01L 2223/5442; H01L 2223/54426; H01L 2223/54453; H01L 21/266
USPC ..................................................... 430/270.1
See application file for complete search history.

(56) References Cited

U.S. PATENT DOCUMENTS

| 2007/0087467 | A1* | 4/2007 | Hsu ................... H01L 27/14632 438/57 |
| 2017/0133227 | A1 | 5/2017 | Kajiwara |
| 2020/0266119 | A1* | 8/2020 | Hara ..................... H01L 23/544 |

FOREIGN PATENT DOCUMENTS

| JP | 2004-031528 A | 1/2004 |
| JP | 2017-092256 A | 5/2017 |
| JP | 2018-052035 A | 4/2018 |

OTHER PUBLICATIONS

An Office Action; "Notice of Reasons for Refusal", dated by the Japanese Patent Office on Oct. 5, 2021, which corresponds to Japanese Patent Application No. 2018-019822 and is related to U.S. Appl. No. 16/179,150; with English language translation.

* cited by examiner

*Primary Examiner* — Caleen O Sullivan
(74) *Attorney, Agent, or Firm* — Studebaker & Brackett PC (57) ABSTRACT

A film resist is a member for being bonded to a main surface of a substrate, which main surface is provided with a mark. The film resist includes a cutout for the mark to be checked.

13 Claims, 11 Drawing Sheets

FILM RESIST AND METHOD OF MANUFACTURING SEMICONDUCTOR DEVICE

BACKGROUND OF THE INVENTION

Field of the Invention

The present invention relates to a film resist used in patterning, and a method of manufacturing a semiconductor device.

Description of the Background Art

A power device, which is an electric power-use semiconductor element, is used in various fields. The various fields include a field such as home appliances, electric vehicles, railroads and the like, and a field such as solar photovoltaic power generation, wind power generation and the like which are increasingly attracting attention as renewable energy.

In such fields, for example, an inverter circuit is configured using the power device, which inverter circuit is used in driving an inductive load such as an induction motor. This configuration requires a freewheeling diode (hereinafter referred to also as the "FWD") for recovering current generated due to counterelectromotive force of the inductive load. A normal inverter circuit is configured using a plurality of gate-insulated bipolar transistors (hereinafter referred to also as the "IGBTs") and FWDs.

What is demanded of an inverter circuit is a reduction in size, weight, and cost. Therefore, desirably, a smaller number of IGBTs and FWDs are used in an inverter circuit. Under the circumstances, a reverse conducting IGBT (hereinafter referred to also as the "RC-IGBT") in which an IGBT and an FWD are integrated is under development.

Use of the RC-IGBT is expected to reduce the area and cost of a circuit equipped with a semiconductor element. In a normal IGBT, at the main surface of the substrate, just a p-type collector layer is formed. In an RC-IGBT, at the main surface of the substrate, a p-type collector layer and an n-type cathode layer are formed.

In an RC-IGBT, an IGBT and an FWD are formed at one semiconductor substrate. Note that, in order to realize a reduction in cost, the IGBT and the FWD must be simultaneously formed.

Normally, from the viewpoint of the electric characteristic, in an individual semiconductor element, the density of the base layer in an IGBT is higher than the density of the anode layer in an FWD. In an RC-IGBT in which an IGBT and an FWD are integrated, the p+ base layer of the IGBT and the p+ anode layer of the FWD are desirably simultaneously formed. Here, when the density of the anode layer is set to be equivalent to that of the base layer, that is, higher than in the normal case, the recovery current of the FWD increases. On the other hand, when the density of the base layer is set to be equivalent to that of the anode layer, that is, lower than in the normal case, the ON voltage of the IGBT increases.

Addressing thereto, there exists the local lifetime control as a scheme of increasing the density of the anode layer so as to be equivalent to the density of the base layer, still minimizing an increase in the recovery current of the FWD. In the local lifetime control, just the FWD region is irradiated with light ions.

Japanese Patent Application Laid-Open No. 2017-092256 discloses a configuration for exerting the local lifetime control (hereinafter referred to also as the "related configuration A"). In the related configuration A, using a mask made of metal (aluminum), or a photoresist as a mask, an IGBT region is shielded. Then, just the FWD region is exposed. Thus, in the FWD region, a lifetime layer is formed.

In patterning, a photomask is positioned using a mark provided at a substrate. Note that, in general, as the thickness of a film resist bonded to a substrate is greater, it becomes difficult to check the mark. Accordingly, what is required is a configuration that allows the mark provided at the substrate to be checked irrespective of the thickness of the film resist. The related configuration A cannot meet the requirement.

SUMMARY

An object of the present invention is to provide a film resist or the like having the configuration that allows a mark provided at a substrate to be checked irrespective of the thickness of the film resist.

A film resist according to one aspect of the present invention is a film resist having photosensitivity and for being bonded to a main surface of a substrate which main surface is provided with a mark. The film resist includes a cutout for the mark to be checked.

According to the present invention, a film resist is a member for being bonded to a main surface of a substrate which main surface is provided with a mark. The film resist is includes a cutout for the mark to be checked.

Thus, the present invention provides a film resist having the configuration that allows a mark provided at a substrate to be checked irrespective of the thickness of the film resist.

These and other objects, features, aspects and advantages of the present invention will become more apparent from the following detailed description of the present invention when taken in conjunction with the accompanying drawings.

DESCRIPTION OF THE PREFERRED EMBODIMENT

In the following, with reference to the drawings, a description will be given of a preferred embodiment of the present invention. In the drawings referred to in the following, identical constituents are denoted by an identical reference character. The name and function of the constituents denoted by an identical reference character are the same. Accordingly, part of the constituents denoted by an identical reference character may be omitted.

Note that, the dimension, material, and shape of each of the constituents illustrated in the preferred embodiment and the relative disposition of the constituents may be changed as appropriate depending on the configuration of an apparatus to which the present invention is applied, various conditions and the like. Further, the dimension of each of the constituents may not coincide with the actual dimension.

First Preferred Embodiment

Figure 1A:
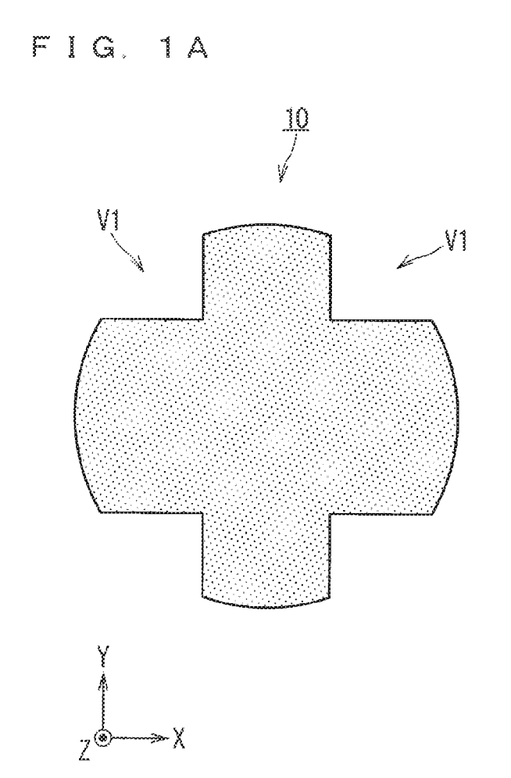
FIGS. 1A and 1B are each an illustration for describing the configuration to a film resist according to a first preferred embodiment is applied.
Figure 1B:
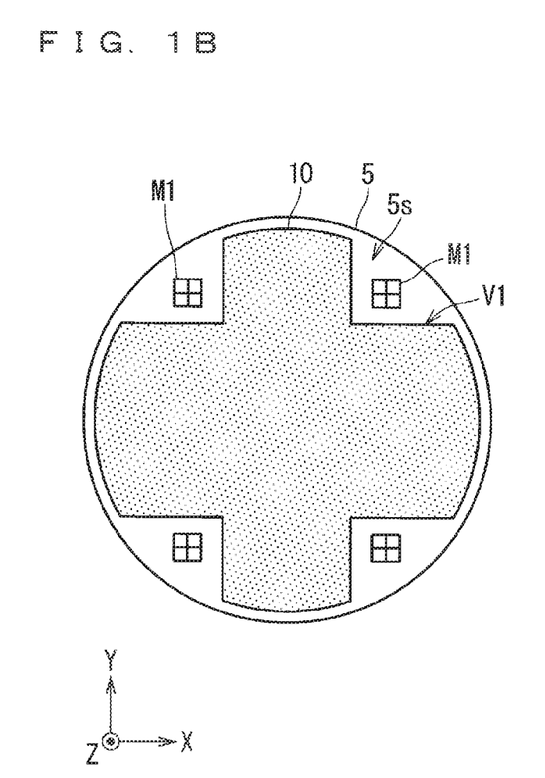

FIGS. 1A and 1B are each an illustration for describing the configuration to which a film resist 10 according to a first preferred embodiment is applied. FIG. 1A is a plan view showing the configuration of the film resist 10. FIG. 1B is a plan view showing the state where the film resist 10 is bonded to a main surface 5s of a substrate 5 (hereinafter referred to also as the "bonded state"). The substrate 5 is, for example, a semiconductor substrate (a semiconductor wafer). The diameter of the substrate 5 is, for example, 8 inches.

In FIGS. 1A and 1B, the X direction, the Y direction, and the Z direction are perpendicular to one another. The X direction, the Y direction, and the Z direction shown in the subsequent drawings are also perpendicular to one another. In the following, a direction including the X direction and a direction opposite to the X direction (the −X direction) is referred to also as the "X-axis direction". Further, hereinafter, a direction including the Y direction and a direction opposite to the Y direction (the −Y direction) is referred to also as the "Y-axis direction". Further, hereinafter, a direction including the Z direction and a direction opposite to the Z direction (the −Z direction) is referred to also as the "Z-axis direction".

Further, hereinafter, a plane including the X-axis direction and the Y-axis direction is referred to also as the "XY plane". Further, hereinafter, a plane including the X-axis direction and the Z-axis direction is referred to also as "the XZ plane". Further, hereinafter, a plane including the Y-axis direction and the Z-axis direction is referred to also as the "YZ plane".

The film resist 10 is a dry film resist having photosensitivity. The film resist 10 is, as an example, a negative type film resist. The negative type film resist has the characteristic in that, the solubility of any exposed portion of the film resist reduces. The solubility refers to the degree of dissolving in a developer.

With reference to FIG. 1B, the shape of the substrate 5 as seen in a plan view (the XY plane) is, for example, a circle. At the main surface 5s of the substrate 5, a mark M1 is provided. The mark M1 is an alignment mark. The mark M1 is used for positioning (aligning), in an exposing step which will be described later, the substrate 5 and a photomask MK1 relative to each other which will be described later. The film resist 10 is a member for being bonded to the main surface 5s of the substrate 5. Hereinafter, an apparatus having the function of positioning the substrate and the photomask MK1 relative to each other is referred to also as the "positioning apparatus". The positioning apparatus has a camera for checking the mark M1 of the substrate mounted on a stage, for example. The positioning apparatus functions to finely adjust the position of the stage based on image information obtained with the camera, so that the substrate and the photomask MK1 establish a predetermined positional relationship.

With reference to FIGS. 1A and 1B, the film resist 10 includes a cutout V1 corresponding to the mark M1 provided at the substrate 5. The cutout V1 is required for the positioning apparatus to check (recognize) the mark M1. The shape of the cutout V1 is, for example, sector-like. In the bonded state, the cutout V1 excludes the mark M1 from the film resist 10.

Hereinafter, in the main surface 5s of the substrate 5, the region not used for forming the semiconductor element is referred to also as the "substrate ineffective region". The substrate ineffective region is, for example, the region not irradiated with ultraviolet rays in the exposing step which will be described later. Note that, the mark M1 is provided in the substrate ineffective region of the main surface 5s of the substrate 5.

Hereinafter, in the film resist, a region not used for processing for forming the semiconductor element and the like is referred to also as the "resist ineffective region". The resist ineffective region of the film resist is a region overlaid on the substrate ineffective region of the substrate 5 in the bonded state. The resist ineffective region of the film resist is, for example, a region not irradiated with ultraviolet rays in the exposing step which will be described later.

The film resist 10 is provided with the cutout V1 so as to exclude the whole substrate ineffective region including the mark M1 from the film resist 10 in the bonded state. Therefore, the shape and size of the cutout V1 shown in FIG. 1A are equivalent to those of the substrate ineffective region.

The film resist 10 is smaller in size than the main surface 5s of the substrate 5. Specifically, the size of the film resist 10 is set so that, as seen in a plan view (the XY plane), the entire film resist 10 is accommodated within the main surface 5s, in other words, the outer portion in the substrate 5 is excluded from the film resist 10 by a certain width.

Hereinafter, the film resist 10 including a removal film 3 bonded thereto is referred to also as the "film resist 10N". The film resist 10N is part of the film roll 10Nr shown in FIG. 2. The film roll 10Nr is formed by the elongated film resist 10N being rolled into a roll.

Figure 3:
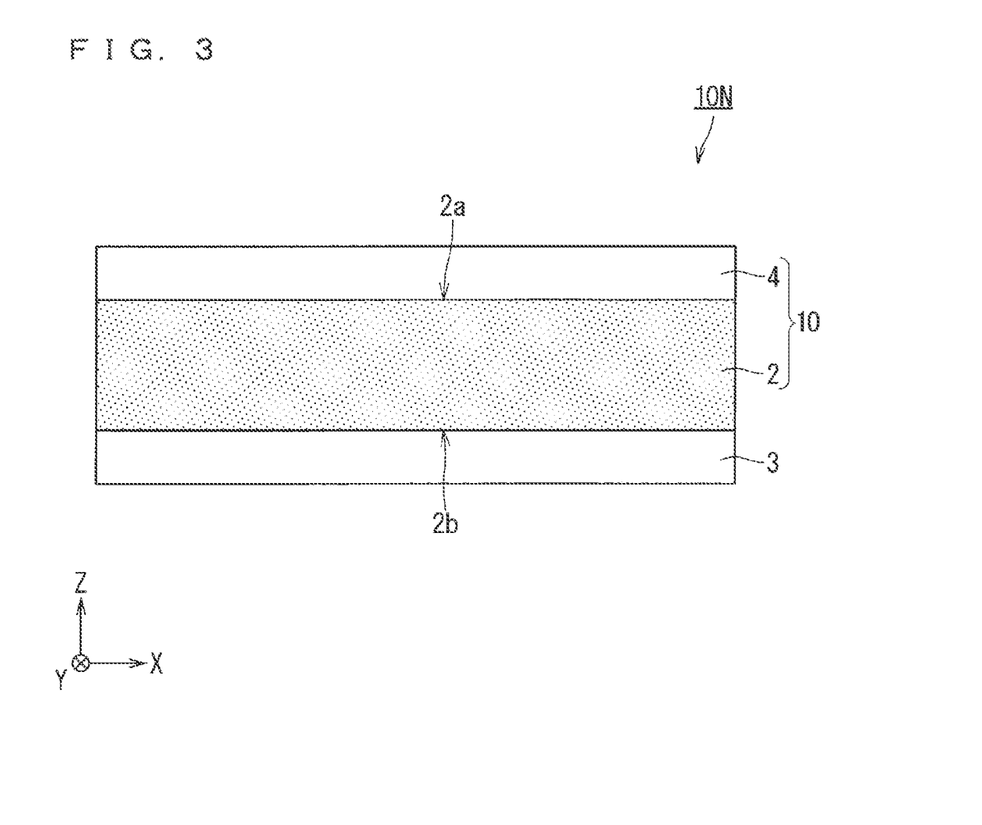
FIG. 3 is an illustration for describing the configuration of the film resist.

Next, a description will be given of the configuration of the film resist 10N. FIG. 3 is an illustration for describing the configuration of the film resist 10N. With reference to FIG. 3, the film resist 10N is, for example, a three-layer film. The film resist 10N includes the film resist 10 and the removal film 3.

The film resist 10 includes a photoresist 2 and a carrier film 4. The photoresist 2 has a thickness of 50 μm or more. The photoresist 2 has surfaces 2a, 2b. To the surface 2a of the photoresist 2, the carrier film 4 is bonded. The surface 2b is a surface to be bonded to the main surface 5s of the substrate 5. To the surface 2b of the photoresist 2, the removal film 3 is bonded. That is, the removal film 3 protects the surface 2b of the photoresist 2. Note that, before the film resist is bonded to the substrate 5, the removal film 3 is removed from the photoresist 2.

Further, the carrier film 4 is provided for protecting the photoresist 2, and stays on the surface 2a of the photoresist 2 from the bonding step which will be described later to the exposing step which will be described later. Note that, after the exposing step is performed, the carrier film 4 is removed from the photoresist 2 before a developing step.

Hereinafter, a method of manufacturing a semiconductor device using the film resist 10 is referred to also as the "manufacturing method Pr". The manufacturing method Pr is the patterning.

Figure 4:
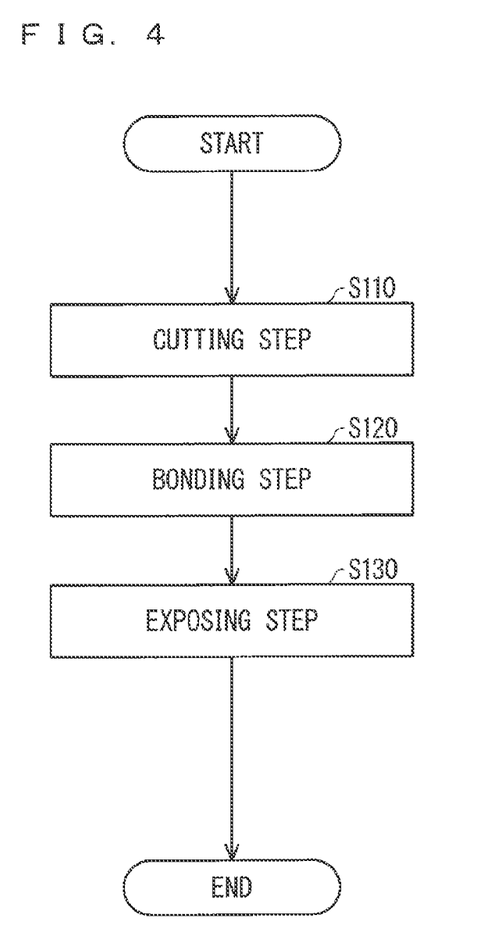
FIG. 4 is a flowchart of a manufacturing method Pr according to the first preferred embodiment.

Next, a description will be given of the manufacturing method Pr. FIG. 4 is a flowchart of the manufacturing method Pr according to the first preferred embodiment. FIG. 4 shows just the main steps included in the manufacturing method Pr.

Figure 2:
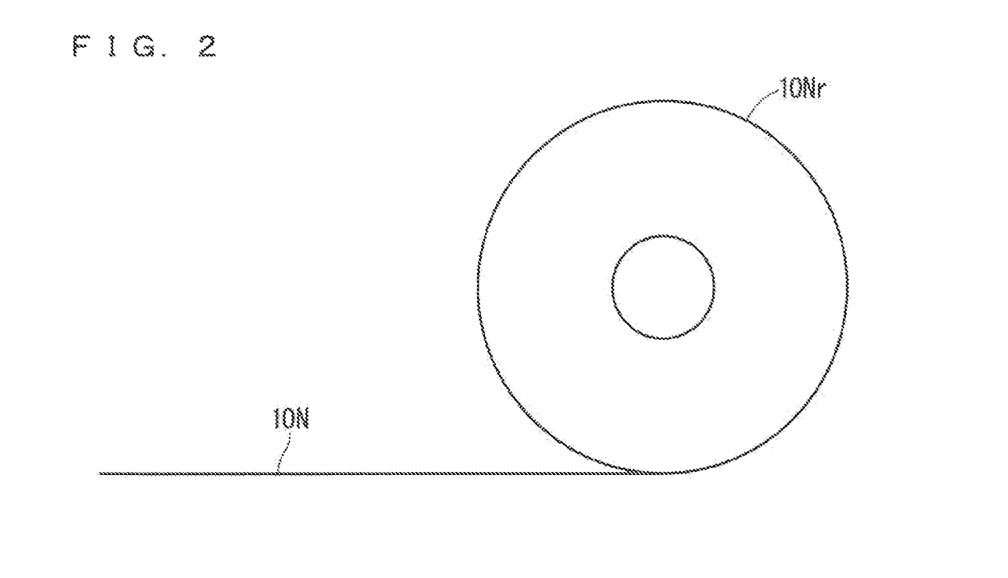
FIG. 2 is an illustration showing a film roll.

In the manufacturing method Pr, firstly, the film resist 10N is cut out from the film roll 10Nr shown in FIG. 2 by a predetermined length.

Figure 5:
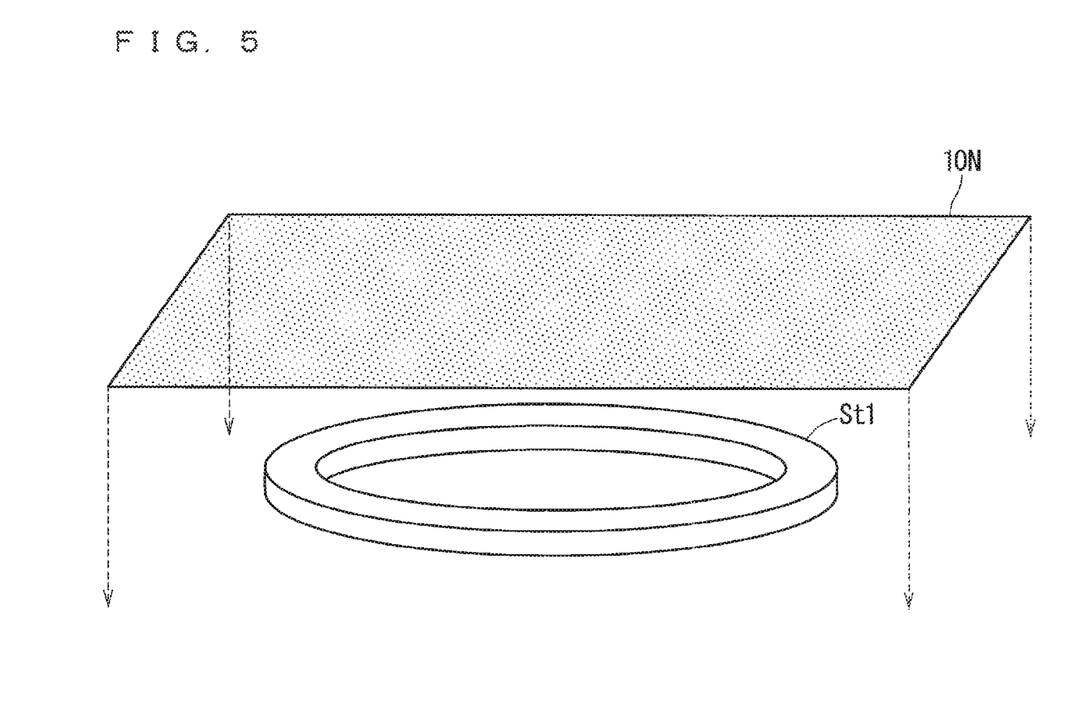
FIG. 5 is an illustration for describing a step of bonding a film resist to a film processing stage.
Figure 6:
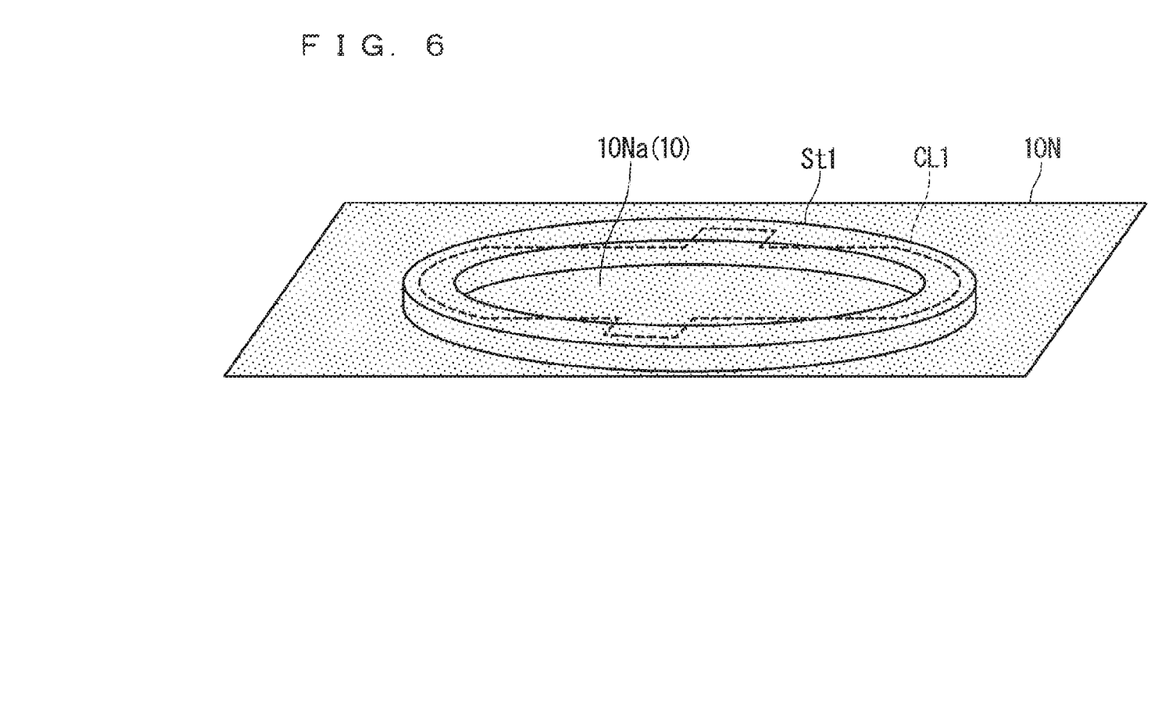
FIG. 6 is an illustration showing the state where the film resist is bonded to the film processing stage.

Next, as shown in FIG. 5, the film resist 10N is bonded to the film processing stage St1 (see FIG. 6). Hereinafter, the film resist 10N being similar in shape to the film resist 10 shown in FIG. 1A is referred to also as the "film resist 10Na". The film resist 10Na includes the film resist 10 and the removal film 3 shown in FIG. 1A. The film resist 10Na is the film resist 10 including the removal film 3 bonded thereto. That is, what is obtained by removing the removal film 3 from the photoresist 2 of the film resist 10Na is the film resist 10 shown in FIG. 1A.

A cut line CL1 is shown in the film resist 10N shown in FIG. 6. The cut line CL1 is a line for cutting out the film resist 10Na from the film resist 10N.

Next, a cutting step (S110) is performed. In the cutting step, a cutting apparatus (not shown) having the function of cutting the film resist is used. In the cutting step, the cutting apparatus cuts along the cut line CL1 of the film resist 10N so that the film resist 10Na is cut out from the film resist 10N. The film resist 10 included in the film resist 10Na is provided with the cutout V1. That is, in the cutting step, the cutting apparatus cuts the film resist 10 so that the cutout V1 is formed at the film resist 10 included in the film resist 10Na. That is, the cutting step is also a cutout forming step of forming the cutout V1 at the film resist 10N (the film resist 10).

Thus, the film resist 10Na is acquired. Note that, the film resist 10 included in the acquired film resist 10Na is smaller in size than the main surface 5s of the substrate 5. Further, the film resist 10 included in the film resist 10Na is provided with the cutout V1.

Next, the removal film 3 is removed from the film resist 10Na. Thus, the film resist 10 is obtained.

Figure 7:
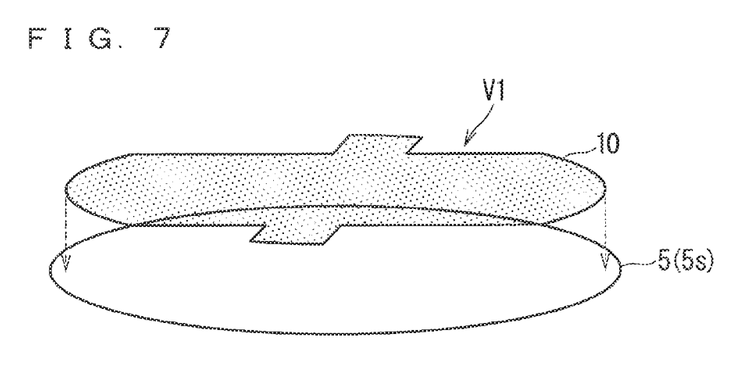
FIG. 7 is an illustration for describing a bonding step.

Next, a bonding step (S120) is performed. In the bonding step, a bonding apparatus (not shown) having the function of bonding the film resist 10 to the substrate 5 is used. In the bonding step, as shown in FIG. 7, the bonding apparatus bonds the film resist 10 to the main surface 5s of the substrate 5. Hereinafter, a region in the main surface 5s being the target of the bonding the film resist is referred to also as the "target region". In the bonding step, the film resist 10 is bonded within the target region of the main surface 5s.

Figure 8:
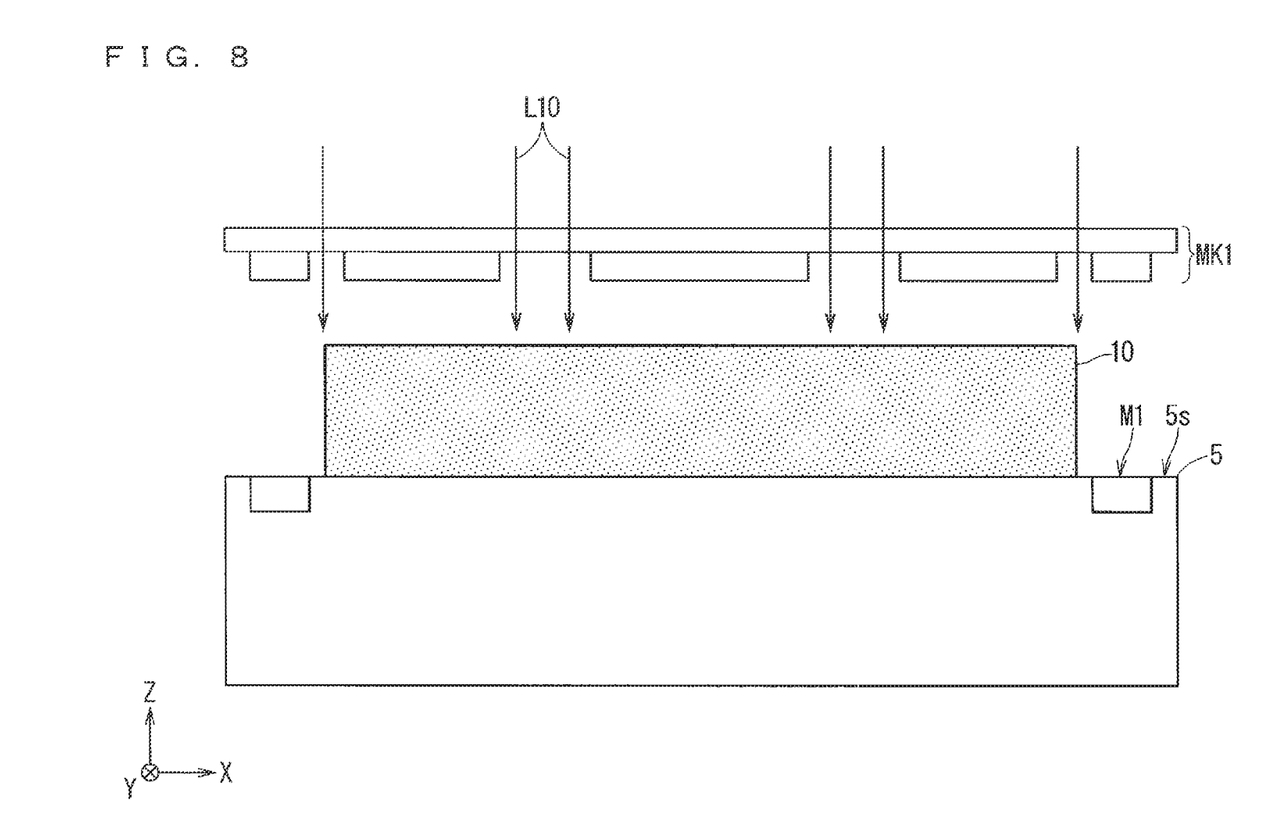
FIG. 8 is an illustration for describing an exposing step.

Next, an exposing step (S130) is performed (see FIG. 8). In the exposing step, firstly, the positioning apparatus positions the substrate 5 and the photomask MK1 relative to each other while checking the position of the mark M1. Specifically, the position of the substrate 5 is finely adjusted using the mark M1, so that the substrate and the photomask MK1 attain a predetermined positional relationship as seen in a plan view (the XY plane). Then, the exposing is performed, that is, irradiating the film resist 10 with ultraviolet rays L10 via the photomask MK1 is performed.

Next, the carrier film 4 is removed from the photoresist 2 of the film resist 10. Thereafter, a developing step or the like is performed. Thus, the manufacturing method Pr (the patterning) ends.

As has been described above, according to the present preferred embodiment, the film resist 10 is a member for being bonded to the main surface 5s of the substrate 5 which main surface 5s is provided with the mark M1. The film resist 10 includes the cutout V1 for the mark M1 to be checked.

This configuration implements a film resist that allows a mark provided at a substrate to be checked irrespective of the thickness of the film resist. Further, in positioning the substrate 5 and the photomask MK1 relative to each other, this configuration allows the mark M1 to be easily checked (visually recognized).

Further, in the present preferred embodiment, the cutout V1 excludes the mark M1 from the film resist 10 in the bonded state. Therefore, this configuration allows the mark M1 at the substrate 5 to be easily visually recognized. Further, in the film resist 10, the cutout V1 is provided so as to exclude the entire substrate ineffective region including the mark M1 from the film resist 10 in the bonded state. Therefore, the risk of a reduction in visibility of the mark M1 is minimized also in the state where the film resist 10 is bonded to the main surface 5s of the substrate 5 so as to slightly extend outside the target region.

Further, in the present preferred embodiment, the film resist 10 is smaller in size than the main surface 5s of the substrate 5. Specifically, the size of the film resist 10 is set so that the entire film resist 10 is accommodated within the main surface 5s as seen in a plan view (the XY plane). Therefore, also in the case where developing or the like is performed in the bonded state, this configuration minimizes the risk of part of the photoresist remaining as a foreign object at the rim of the main surface 5s of the substrate 5.

Further, in the present preferred embodiment, the cutting step (S110) is performed before the bonding step (S120). That is, before the bonding step is performed, the cutout V1 is formed at the film resist. Therefore, this configuration allows the mark M1 to be easily visually recognized in the positioning the photomask MK1 in the bonded state.

Note that, in the related configuration A, when just the FWD region is irradiated with light ions (for example, protons), the IGBT region must be prevented from being irradiated with the protons. Here, since the range of the protons in the photoresist is about 50 μm, the photoresist must have a thickness of 50 μm or more.

However, when patterning is performed on the substrate provided with the alignment mark using a photoresist having a thickness of 50 μm or more, the following problem arises. That is, the alignment mark is a mark for positioning the photomask relative to the substrate in the patterning using the photomask. Specifically, when the photoresist is covering the alignment mark when the patterning is performed using the photomask, there arises a problem that the alignment mark cannot be detected.

Note that, die photoresist is high in viscosity. Therefore, in forming a film by spin coating, the photoresist is formed with a greater thickness at the end of the wafer. Further, the photoresist may remain as a foreign object at a portion where the photoresist cannot be removed even by the edge rinse or back rinse process. Therefore, there exists a problem that, in the processes subsequent to the manufacturing method Pr, the yield may reduce due to the foreign object.

Here, the film resist 10 according to the present preferred embodiment is configured as described above. Therefore, the film resist 10 according to the present preferred embodiment and the manufacturing method Pr using the film resist 10 can solve the above-described problems.

<First Variation>

Hereinafter, the configuration of the first preferred embodiment is referred to also as the "configuration Ct1". Further, hereinafter, the configuration of the present variation is referred to also as the "configuration Ctm1". The configuration Ctm1 is a configuration in which the size of the cutout V1 is smaller. The configuration Ctm1 is applied to the configuration Ct1 (the first preferred embodiment).

Figure 9A:
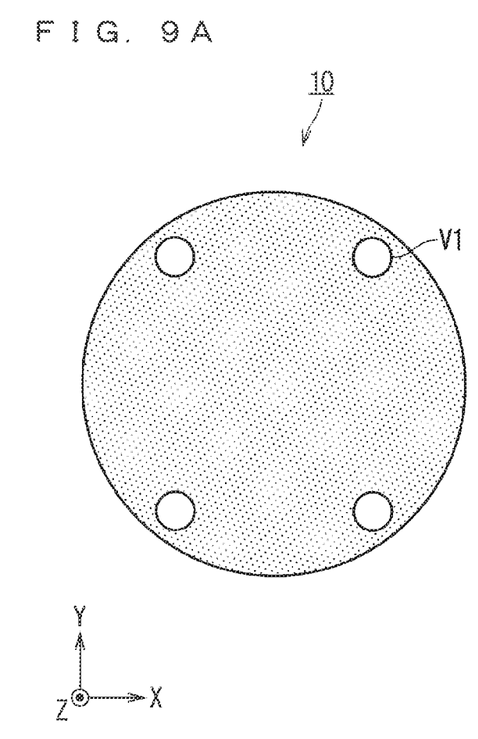
FIGS. 9A and 9B are each an illustration for describing a film resist according to a first variation.
Figure 9B:
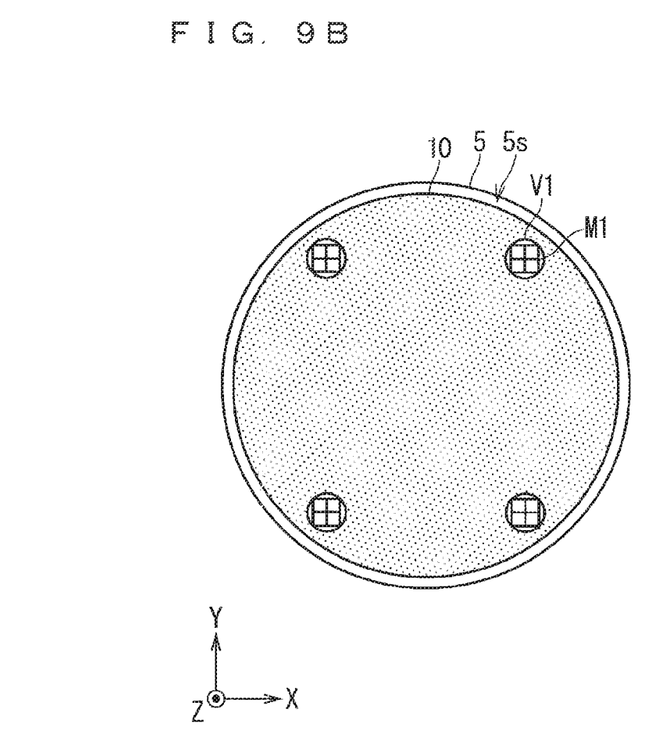

FIGS. 9A and 9B are each an illustration for describing the film resist 10 according to the first variation. FIG. 9A is a plan view of the film resist 10 having the configuration Ctm1. FIG. 9B is a plan view of the film resist 10 in the bonded state.

With reference to FIGS. 9A and 9B, the film resist 10 having the configuration Ctm1 is different from the film resist 10 shown in FIG. 1A in that the shape of the cutout V1 is a circle and the size of the cutout V1 is smaller. The rest of the configuration of the film resist 10 having the configuration Ctm1 is similar to that of the film resist 10 shown in FIG. 1A and, therefore, a detailed description thereof is not repeated.

In the bonded state, the cutout V1 excludes the mark M1 from the film resist 10. The size of the cutout V1 is set to a minimum size just enough for the cutout V1 to exclude the entire mark M1 from the film resist 10. That is, the size of the cutout V1 is slightly greater than the mark M1. For example, the cutout V1 is k times as great as the size of the mark M1. k is, for example, a real number falling within a range of 1.1 to 1.2 inclusive.

Hereinafter, the film resist 10 including no cutout V1 is referred to also as the "film resist $10n$V". The shape of the film resist $10n$V is, as an example, a circle (see FIG. 10A). Hereinafter, an apparatus having the function of emitting laser light is referred to also as the "laser apparatus".

In the manufacturing method Pr in the configuration Ctm1, a cutout forming step is performed between the cutting step (S110) and the bonding step (S120). Hereinafter, a brief description will be given of the manufacturing method Pr in the configuration Ctm1.

Firstly, similarly to the first preferred embodiment, the film resist 10N is bonded to the film processing stage St1 (see FIG. 6).

Next, in the cutting step (S110), the cutting apparatus (not shown) cuts the film resist 10N so as to cut out the film resist $10n$V from the film resist 10N shown in FIG. 6.

Next, the cutout forming step is performed. In the cutout forming step, the laser apparatus irradiates the film resist $10n$V with laser light so that the cutout V1 is formed at the film resist $10n$V. Specifically, in the cutout forming step, the laser apparatus successively irradiates four locations in the film resist $10n$V with the laser light so that four cutouts V1 shown in FIG. 9A are formed at the film resist $10n$V.

Thus, the carrier film 4 and the photoresist 2 existing at the four locations in the film resist $10n$V are removed. As a result, the film resist 10 shown in FIG. 9A is formed.

Thereafter, similarly to the first preferred embodiment, the bonding step (S120) and the steps subsequent thereto are performed.

As has been described above, according to the present variation, the size of the cutout V1 is the minimum size just enough for the cutout V1 to exclude the entire mark M1 from the film resist 10 in the bonded state. Therefore, this configuration reduces the processed amount of the film resist while maintaining the visibility of the mark M1.

Note that, the circular cutout V1 is not limited to the configuration in which it is formed by using laser light. The cutout V1 may be formed by cutting using a cutting apparatus. In such a configuration, in the cutout forming step, the cutting apparatus successively performs cutting (punching) at the four locations in the film resist $10n$V so that four cutouts V1 shown in FIG. 9A are formed at the film resist $10n$V.

<Second Variation>

Hereinafter, the configuration of the present variation is referred to also as the "configuration Ctm2". The configuration Ctm2 is a configuration in which, after the film resist is bonded to the substrate 5, the cutout V1 is formed at the film resist. The configuration Ctm2 is applied to the configuration Ct1 (the first preferred embodiment). Hereinafter, the state where the film resist $10n$V is bonded to the main surface $5s$ of the substrate 5 is referred to also as the "bonded state".

Figure 10A:
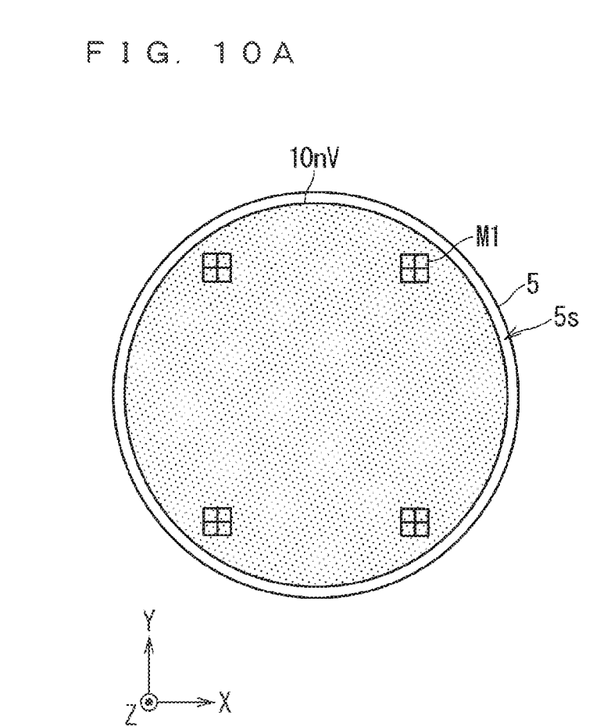
FIGS. 10A and 10B are each an illustration for describing a film resist according to a second variation.
Figure 10B:
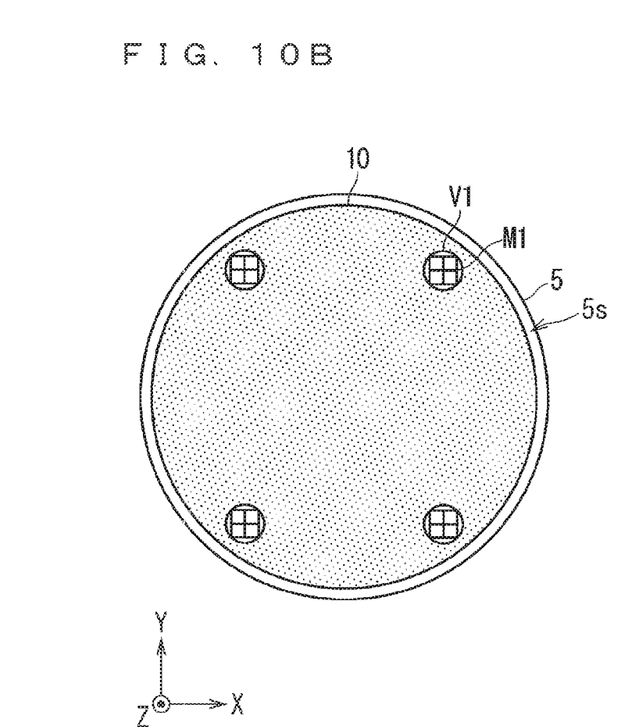

FIGS. 10A and 10B are each an illustration for describing the film resist according to the second variation. FIG. 10A is a plan view of the film resist $10n$V and the substrate 5 in the bonded state. FIG. 10B is an illustration showing the state where the cutout V1 is formed at the film resist in the bonded state. The shape and size of the cutout V1 in the configuration Ctm2 is similar to the shape and size of the cutout V1 in the configuration Ctm1.

Figure 11:
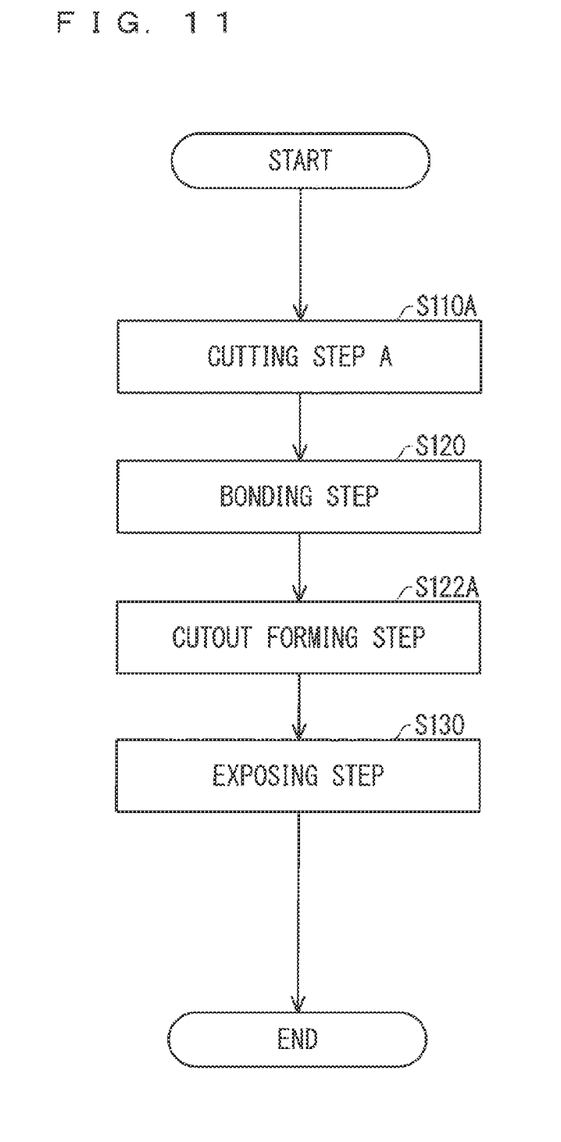
FIG. 11 is a flowchart of a manufacturing method Pra according to a second variation.

Hereinafter, the manufacturing method Pr to which the configuration Ctm2 is applied is referred to also as the "manufacturing method Pra". FIG. 11 is a flowchart of the manufacturing method Pra according to the second variation. FIG. 11 shows just the main steps included in the manufacturing method Pra. In FIG. 11, the steps denoted by step numbers identical to those in FIG. 4 are the processes similar to those described in the first preferred embodiment and, therefore, a detailed description thereof is not repeated. Hereinafter, a description will be mainly given of the difference from the first preferred embodiment.

In the manufacturing method Pra, in the cutting step A (S110A), the cutting apparatus (not shown) cuts the film resist 10N so as to cut out the film resist $10n$V from the film resist 10N shown in FIG. 6.

Next, the bonding step (S120) is performed. In the bonding step, the bonding apparatus bonds the film resist $10n$V to the main surface $5s$ of the substrate 5.

Next, the cutout forming step (S122A) is performed. In the cutout forming step, in the bonded state, the laser apparatus irradiates the film resist $10n$V with laser light so that the cutout V1 is formed at the film resist $10n$V.

Hereinafter, in the main surface $5s$ of the substrate 5, the location (coordinates) where the mark M1 exists is referred to also as the "location Lm". In the configuration shown in FIG. 10A, four locations Lm exist. Specifically, in the cutout forming step (S122A), the laser apparatus successively irradiates the four locations Lm in the film resist $10n$V with laser light so that four cutouts V1 shown in FIG. 10B are formed at the film resist $10n$V.

Thus, the carrier film 4 and the photoresist 2 existing at the four locations Lm in the film resist $10n$V are removed. As a result, the film resist 10 shown in FIG. 10B is formed.

Thereafter, similarly to the first preferred embodiment, the exposing step (S130) and the steps subsequent thereto are performed.

As has been described above, according to the present variation, in the bonded state, each cutout V1 is formed at the film resist. Note that, the size of such a cutout V1 is the minimum size just enough for the cutout V1 to exclude the entire mark M1 from the film resist 10 in the bonded state. Therefore, this configuration reduces the processed amount of the film resist while maintaining the visibility of the mark M1.

<Third Variation>

Hereinafter, the configuration of the present variation is referred to also as the "configuration Ctm3". The configuration Ctm3 is another configuration in which, after the film resist is bonded to the substrate 5, the cutout V1 is formed at the film resist. The configuration Ctm3 is applied to the configuration Ct1 (the first preferred embodiment).

Figure 12A:
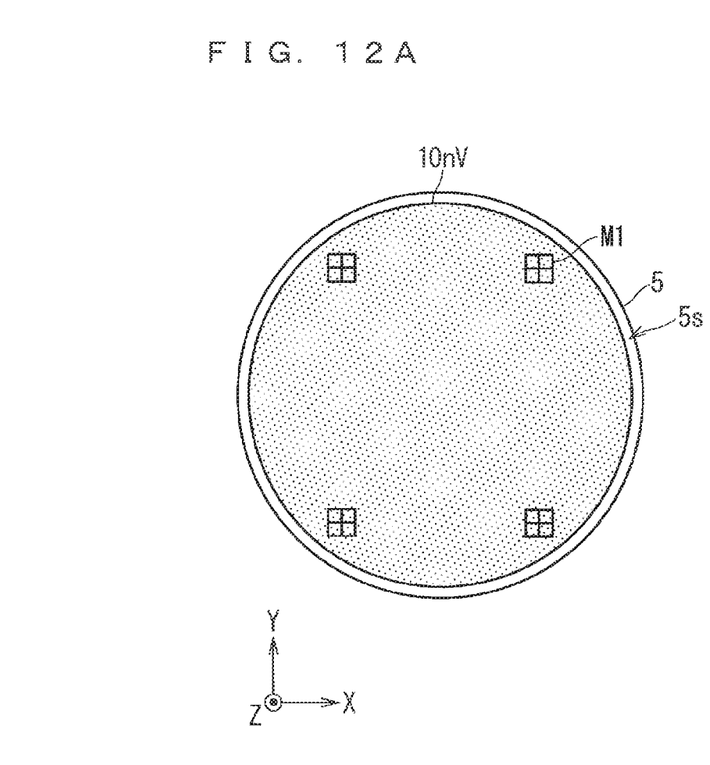
FIGS. 12A and 12B are each an illustration for describing a film resist according to a third variation.
Figure 12B:
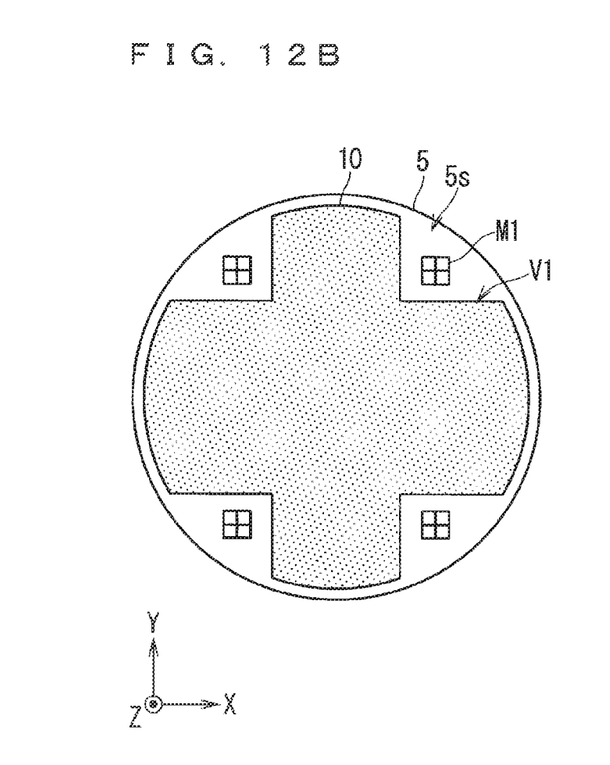

FIGS. 12A and 12B are each an illustration for describing the film resist 10 according to a third variation. FIG. 12A is a plan view of the film resist 10nV and the substrate 5 in the bonded state. FIG. 12B is an illustration showing the state where the cutout V1 is formed at the film resist 10 in the bonded state. The shape and size of the cutout V1 in the configuration Ctm3 are identical to those of the cutout V1 in the configuration Ct1.

In the configuration Ctm3, in the bonded state, the cutout V1 is provided to the film resist 10 so as to exclude the entire substrate ineffective region including the mark M1 from the film resist 10. That is, in the bonded state, the cutout V1 excludes the mark M1 from the film resist 10.

Next, a description will be given of the manufacturing method Pra to which the configuration Ctm3 is applied. With reference to FIG. 11, similarly to the second variation, in the manufacturing method Pra, the cutting step A (S110A) and the bonding step (S120) are performed. Thus, the bonding apparatus bonds the film resist 10nV to the main surface 5s of the substrate 5.

Next, the cutout forming step (S122A) is performed. In the cutout forming step, in the bonded state, the cutting apparatus cuts the film resist 10nV so that the cutout V1 shown in FIGS. 1A and 12B is formed at the film resist 10nV. The cutting the film resist 10nV is performed on the film resist 10nV just by a depth corresponding to the thickness of the film resist 10nV. As a result, the film resist 10 shown in FIG. 12B is formed.

Thereafter, similarly to the first preferred embodiment, the exposing step (S130) and the steps subsequent thereto are performed.

As has been described above, the present variation exhibits the effect similarly to that the first preferred embodiment does. Further, in the bonded state, the cutout V1 is provided to the film resist 10 so as to exclude the entire substrate ineffective region including the mark M1 from the film resist 10. Note that, the size of the cutout V1 is fully greater than the size of the mark M1. Thus, also in the case where the film resist is bonded to the main surface 5s of the substrate 5 so as to slightly extend outside the target region, the risk of a reduction in visibility of the mark M1 is minimized.

Note that, within the scope of the present invention, the preferred embodiment and the variations can be freely combined, modified or omitted as appropriate.

For example, the shape of the cutout V1 is not limited to sector-like or circular. The shape of the cutout V1 may be, for example, the same as the shape of the mark M1 (a quadrangle).

Further, for example, the shape of the mark M1 is not limited to a quadrangle. The shape of the mark M1 may be, for example, a circle.

Still further, for example, the shape of the film resist 10 is not limited to the shape of the film resist 10 shown in FIG. 1A or the shape of the film resist 10 shown in FIG. 9A, and may be in other shape.

Still further, for example, the number of the cutout V1 formed at the film resist 10 is not limited to four. The cutout V1 at the film resist 10 should be formed as many as the mark M1 provided at the main surface 5s of the substrate 5. For example, when the number of the mark M1 provided at the main surface 5s of the substrate 5 is six, the number of the cutout V1 formed at the film resist 10 is six.

Further, for example, while it has been described that the film resist 10 is a negative type film resist, the present invention is not limited thereto. The film resist 10 may be a positive type film resist.

While the invention has been shown and described in detail, the foregoing description is in all aspects illustrative and not restrictive. It is therefore understood that numerous modifications and variations can be devised without departing from the scope of the invention.

What is claimed is:

1. A film resist having photosensitivity and for being bonded to a main surface of a substrate which main surface is provided with a mark, the film resist comprising
a cutout for the mark to be checked, wherein
the film resist is a dry film resist, and
a shape of the cutout is sector-like or quadrangular.

2. The film resist according to claim 1, wherein, in a state where the film resist is bonded to the main surface, the cutout excludes the mark from the film resist.

3. The film resist according to claim 1, wherein the film resist is smaller in size than the main surface of the substrate.

4. A method of manufacturing a semiconductor device using a film resist having photosensitivity and for being bonded to a main surface of a substrate which main surface is provided with a mark, the method comprising the steps of:
(a) bonding the film resist to the main surface; and
(b) forming a cutout for the mark to be checked at the film resist, wherein
the film resist is a dry film resist, and
a shape of the cutout is sector-like or quadrangular.

5. The method of manufacturing a semiconductor device according to claim 4, wherein, in the state where the film resist is bonded to the main surface, the cutout excludes the mark from the film resist.

6. The method of manufacturing a semiconductor device according to claim 4, wherein the step (b) is performed before the step (a).

7. The method of manufacturing a semiconductor device according to claim 6, wherein, in the step (b), the film resist is cut so that the cutout is formed at the film resist.

8. The method of manufacturing a semiconductor device according to claim 6, wherein, in the step (b), the film resist is irradiated with laser light so that the cutout is formed at the film resist.

9. The method of manufacturing a semiconductor device according to claim 4, wherein the step (b) is performed after the step (a).

10. The method of manufacturing a semiconductor device according to claim 9, wherein, in the step (b), the film resist is cut so that the cutout is formed at the film resist.

11. The method of manufacturing a semiconductor device according to claim 9, wherein, in the step (b), the film resist is irradiated with laser light so that the cutout is formed at the film resist.

12. The method of manufacturing a semiconductor device according to claim 4, wherein, the film resist is smaller in size than the main surface of the substrate.

13. A method of manufacturing a semiconductor device using a film resist having photosensitivity and for being bonded to a main surface of a substrate which main surface is provided with a mark, the method comprising the steps of:
(a) bonding the film resist to the main surface; and
(b) forming a cutout for the mark to be checked at the film resist, wherein
the step (b) is performed before the step (a), and
the film resist is a dry film resist.

* * * * *